(12) United States Patent
Yang

(10) Patent No.: US 8,890,732 B2
(45) Date of Patent: Nov. 18, 2014

(54) SAMPLING CIRCUIT FOR ADC

(71) Applicant: IPGoal Microelectronics (Sichuan) Co., Ltd., Sichuan (CN)

(72) Inventor: Baoding Yang, Sichuan (CN)

(73) Assignee: IPGoal Microelectronics (Sichuan) Co., Ltd., Chengdu, Sichuan Province (CN)

( * ) Notice: Subject to any disclaimer, the term of this patent is extended or adjusted under 35 U.S.C. 154(b) by 0 days.

(21) Appl. No.: 14/060,510

(22) Filed: Oct. 22, 2013

(65) Prior Publication Data

US 2014/0176354 A1     Jun. 26, 2014

(30) Foreign Application Priority Data

Oct. 23, 2012  (CN) .......................... 2012 1 0405326

(51) Int. Cl.
  *H03M 1/00*     (2006.01)
  *H03M 1/12*     (2006.01)
(52) U.S. Cl.
  CPC .................................... *H03M 1/124* (2013.01)
  USPC .......................................... 341/122; 341/155

(58) Field of Classification Search
  CPC ...... H03M 1/124; H03M 1/0818; H03M 1/12
  USPC .......................................... 341/122, 155, 123
  See application file for complete search history.

(56) References Cited

U.S. PATENT DOCUMENTS

| | | | |
|---|---|---|---|
| 8,638,128 B1* | 1/2014 | Oo .................................. | 327/94 |
| 2006/0192546 A1* | 8/2006 | Geelen ............................ | 324/94 |
| 2011/0148473 A1* | 6/2011 | Wu et al. ......................... | 327/94 |
| 2013/0222163 A1* | 8/2013 | Darthenay ..................... | 341/122 |

* cited by examiner

*Primary Examiner* — Peguy Jean Pierre

(57) ABSTRACT

A sampling circuit for ADC includes an external input terminal, a sampling circuit and an auxiliary circuit which are connected with the external input terminal, a clock circuit and an external output terminal which are connected with the sampling circuit, and a clock feedthrough circuit connected with the auxiliary circuit, wherein the clock feedthrough circuit is respectively connected with the clock circuit and the external output terminal. The sampling circuit for ADC of the present invention decreases the impact of clock feedthrough on signal sampling, improves linearity of sampling FET, reduces harmonic distortion of the sampling circuit and improves sampling speed thereof, and improves sampling accuracy of the sampling circuit for ADC.

8 Claims, 3 Drawing Sheets

SAMPLING CIRCUIT FOR ADC

BACKGROUND OF THE PRESENT INVENTION

1. Field of Invention

The present invention relates to a field of a sampling circuit, and more particularly to a sample-and-hold circuit for ADC (Analog-to-Digital Converter).

2. Description of Related Arts

In the circuit for ADC (Analog-to-Digital Converter), in order to ensure the accuracy and speed of the ADC, the input sampling terminal have to employ a bootstrap structure to ensure the linearity of the input sampling switch and to expand the range of the input signal as well. However, while adopting the sampling circuit having the bootstrap structure, error introduced by the clock feedthrough is related to the signals inputted, and thus non-linear error is introduced, and the impact of the clock feedthrough is not capable of being eliminated by adopting a fully-differential structure amplifier.

Referring to FIG. 1 of the drawings, the conventional sampling circuit for ADC comprises a clock circuit, a sampling circuit and a capacitor C0, wherein the clock circuit generates clock pulses and outputs the clock pulses generated thereby to the sampling circuit via an output terminal K0 thereof, so as to control sampling operation of the sampling circuit by the clock pulses. The sampling circuit comprises a bootstrap unit and a field effect transistor (FET) M1, wherein two input terminals of the bootstrap unit are respectively connected with an output terminal K0 of the clock circuit and an external input terminal, the external input terminal inputs a signal VIN to an input terminal of the bootstrap unit, in such a manner that when an output of K0 is at high level, a voltage difference between a voltage V0 output by the bootstrap unit and a voltage of a signal VIN inputted thereof is a constant voltage VC, i.e., V0=VIN+VC, so as to improve the voltage outputted by V0; when the output of K0 is at low level, V0=0, (V0 outputted is at low level), i.e., the output voltage V0 of the input signal VIN which passes through the bootstrap unit is controlled by the clock circuit. An output terminal of the bootstrap unit is connected with a gate electrode of the FET M1, a source electrode of the FET M1 is connected with an external input terminal. When V0 is at high level, the FET M1 samples the input signal VIN of the external output terminal and outputs a VOUT via a drain electrode thereof. A first end of the capacitor C0 is connected with the drain electrode of the FET M1, a second end thereof is grounded, so as to maintain a voltage of a signal obtained by sampling of the FET M1, i.e., when the output terminal K0 of the clock circuit outputs a low level voltage to cause that V0 is at low level, the signal obtained by sampling of the FET M1 is not impacted and is maintained by the capacitor C0.

In the process mentioned above, a positive going input of the external input is set to be VIN1, and an inverted input thereof is VIN2. When the external input is the positive going input VIN1 and the output of K0 is converted from a high level to a low level, the voltage of V0 drops from a high level VIN+VC to 0, in such a manner that the FET M1 introduces the clock feedthrough which has following effect on the sampling signal:

$$\Delta V_{OUTP} = -\frac{C_{P\_GD\_M1}}{C_{P\_GD\_M1} + C_0}(VIN1 + VC) \quad (1)$$

wherein $C_{P\_GD\_M1}$ in the expression is a parasitic capacitance between gate electrode and drain electrode of the FET M1.

When the circuit adopts the fully-differential structure, the positive going input and the inverted input have same structures, so the invented input is VIN2 has an impact on the sampling signal as follows:

$$\Delta V_{OUTN} = -\frac{C_{N\_GD\_M1}}{C_{N\_GD\_M1} + C_0}(VIN2 + VC) \quad (2)$$

wherein in the expression (2), since the clock pulses are converted from a low level to a high level, $C_{N\_GD\_M1}$ is a parasitic capacitance between gate electrode and drain electrode of the FET M1 while under an inverted input, because the sampling circuit has a same structure during the positive going input and the inverted input, $C_{N\_GD\_M1} = C_{P\_GD\_M1} = C_{GD\_M1}$.

Combining expressions (1) and (2), a dynamic voltage of a differential sampling output signal is:

$$\Delta V_{DIFF} = \Delta V_{OUTP} - \Delta V_{OUTN} = -\frac{C_{GD\_M1}}{C_{GD\_M1} + C_0}(VIN1 - VIN2) \quad (3)$$

It can be seen from the expression (3) that: error of the differential sampling output signal brought by the clock feedthrough effect introduced by the parasitic capacitance between the gate electrode and the drain electrode of the FET M1 is proportional to the differential input signal, variation of the dynamic voltage is non linear and is not capable of being eliminated by the differential structure itself. In addition, the greater the parasitic capacitance of the EFT M1, the greater the amplitude of the input signal, and the more obvious of the nonlinearity introduced by the clock feedthrough effect, which has a serious effect on the accuracy of the differential sampling output signal.

Therefore, in order to overcome the shortcomings mentioned above, it is necessary to provide an improved sampling circuit for ADC.

SUMMARY OF THE PRESENT INVENTION

An object of the present invention is to provide a sampling circuit for ADC, which decreases the impact of clock feedthrough on signal sampling, improves linearity of sampling FET, reduces harmonic distortion of the sampling circuit and improves sampling speed thereof, and improves sampling accuracy of the sampling circuit for ADC.

Accordingly, in order to accomplish the above objects, the present invention provides a sampling circuit for ADC (Analog-to-Digital Converter), comprising:

an external input terminal, a sampling circuit and an auxiliary circuit which are connected with the external input terminal, a clock circuit and an external output terminal which are connected with the sampling circuit, and a clock feedthrough circuit connected with the auxiliary circuit, wherein the clock feedthrough circuit is respectively connected with the clock circuit and the external output terminal.

Preferably, the clock circuit has a first output terminal and a second output terminal, and the first output terminal and the second output terminal output complementary clock pulses;

wherein the sampling circuit samples signals inputted by the external input terminal under control of clock pulses outputted by the first output terminal of the clock circuit, and outputs signals obtained by sampling to the external output terminal;

wherein the auxiliary circuit samples the signals inputted by the external input terminal under control of the sampling circuit, and preserves signals obtained by sampling; and wherein the clock feedthrough circuit processes signals obtained by sampling of the auxiliary circuit under control of clock outputted by the second output terminal of the clock circuit so as to generate a transient compensation voltage having an opposite direction with a dynamic voltage in the sampling circuit, and outputs the transient compensation voltage to the external output terminal.

Preferably, the sampling circuit comprises a first bootstrap unit and a first FET, wherein two output terminals of the first bootstrap unit are respectively connected with the first output terminal of the clock circuit and the external input terminal, wherein an output terminal of the first bootstrap unit is connected with a gate electrode of the first FET, wherein a source electrode of the first FET is connected with the external input terminal, and a drain electrode of the first FET outputs signals by sampling.

Preferably, the sampling circuit for ADC further comprises a first capacitor, wherein a first end of the first capacitor is connected with a drain electrode of the first FET, and a second end thereof is grounded, so as to preserve signals and voltages obtained by sampling of the sampling circuit.

Preferably, the auxiliary circuit comprises a second FET and a second capacitor, wherein a gate electrode of the second FET is connected with the gate electrode of the first FET, and a source electrode thereof is connected with the external input terminal, wherein the second FET samples signals inputted by the external input terminal under control of the sampling circuit, and wherein a first end of the second capacitor is connected with a drain electrode of the second FET, and a second end thereof is grounded, so as to preserve signals and voltages obtained by sampling of the second FET.

Preferably, the clock feedthrough circuit comprises a third FET and a second bootstrap unit, wherein two input terminals of the second bootstrap unit are respectively connected with the second output terminal of the clock circuit and the first end of the second capacitor, wherein an output terminal of the second bootstrap unit is connected with a gate electrode of the third FET, and both a drain electrode and a source electrode of the third FET are connected with the external output terminal.

Preferably, the first FET and the second FET have the same parameters.

Preferably, a sum of a gate-drain parasitic capacitance and a gate-source parasitic capacitance of the third FET is equal to a gate-drain parasitic capacitance of the first FET.

Compared with the prior art, the sampling circuit for ADC of the present invention samples the external input signals by the auxiliary circuit, and outputs the signals after the sampling to the clock feedthrough circuit. The clock feedthrough circuit processes signals obtained by sampling of the auxiliary circuit under control pulses of the clock circuit so as to generate a transient compensation voltage having an opposite direction with a dynamic voltage in the sampling circuit, and outputs the transient compensation voltage to the external output terminal, in such a manner that the transient compensation voltage is capable of effectively decreasing or even eliminating impacts of the clock feedthrough in the sampling circuit to signal sampling, improving linearity of sampling FET, reducing harmonic distortion of the sampling circuit and improving sampling speed thereof, and improving sampling accuracy of the sampling circuit for ADC.

These and other objectives, features, and advantages of the present invention will become apparent from the following detailed description, the accompanying drawings, and the appended claims.

DETAILED DESCRIPTION OF THE PREFERRED EMBODIMENT

Combining with the accompanying drawings, preferred embodiment of the present invention is illustrated as follows. As mentioned above, the present invention provides a sampling circuit for ADC, which improves linearity of sampling FET, reduces harmonic distortion of the sampling circuit and improves sampling speed thereof, and improves sampling accuracy of the sampling circuit for ADC.

Figure 1:
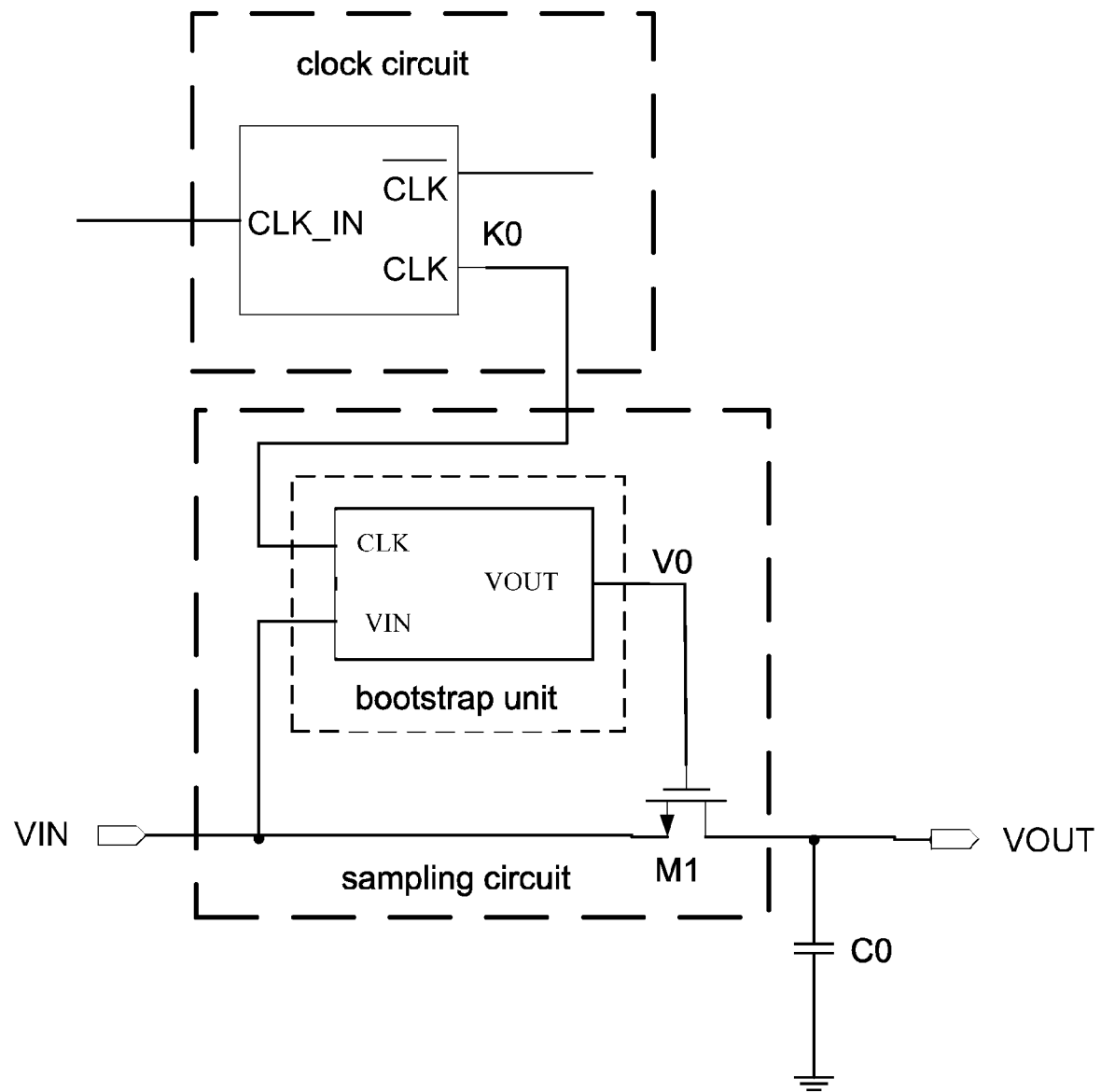
FIG. 1 is a circuit schematic view of a sampling circuit for ADC in the prior art.
Figure 2:
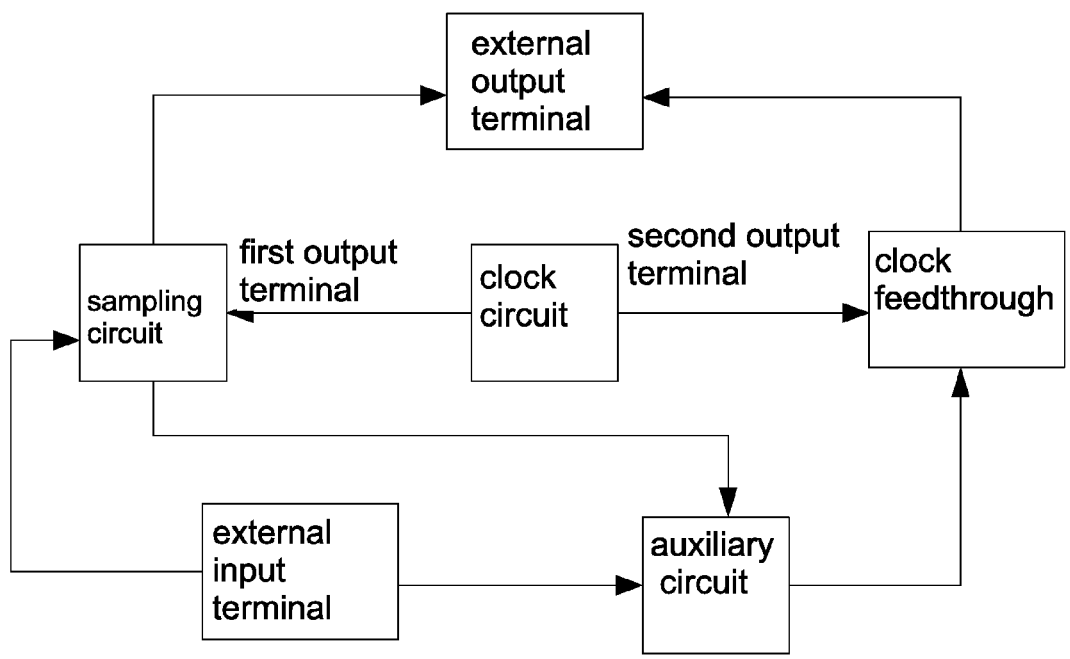
FIG. 2 is a structural block diagram of a sampling circuit for ADC according to a preferred embodiment of the present invention.

Referring to FIG. 2 of the drawings, according to a preferred embodiment of the present invention is illustrated, a sampling circuit for ADC comprising:

an external input terminal, a sampling circuit and an auxiliary circuit which are connected with the external input terminal, a clock circuit and an external output terminal which are connected with the sampling circuit, and a clock feedthrough circuit connected with the auxiliary circuit, wherein the clock feedthrough circuit is respectively connected with the clock circuit and the external output terminal, wherein the clock circuit outputs clock pulses, and is connected with the sampling circuit and the clock feedthrough circuit, in such a manner that the clock circuit controls operation of the sampling circuit and the clock feedthrough circuit through the clock pulses;

wherein the sampling circuit is connected with the external input terminal and the external output terminal, samples signals inputted by the external input terminal under control of the clock pulses and outputs sampling signals via the external output terminal;

wherein the auxiliary circuit is respectively connected with the sampling circuit, the external input terminal and the clock feedthrough circuit, the auxiliary circuit samples signals inputted by external input terminal under control of the sampling circuit and preserves sampling result, and inputs sampling signal to the clock feedthrough circuit;

wherein the clock feedthrough circuit is connected with external output terminal, processes signals obtained by sampling of the auxiliary circuit under control of the clock pulses, so as to generate a transient compensation voltage having an opposite direction with a dynamic voltage in the sampling circuit, and outputs the transient compensation voltage to the external output terminal; and wherein sampling signals and dynamic voltages outputted by the sample circuit and the transient compensation voltage outputted by the clock feedthrough circuit is combined and outputted by the output terminal, in such a manner that the transient compensation voltage is capable of decreasing or even eliminating impacts of the clock feedthrough generated by the sample circuit to structures of the whole circuit, so as to improve sampling speed and sampling accuracy of the sampling circuit for ADC.

Figure 3:
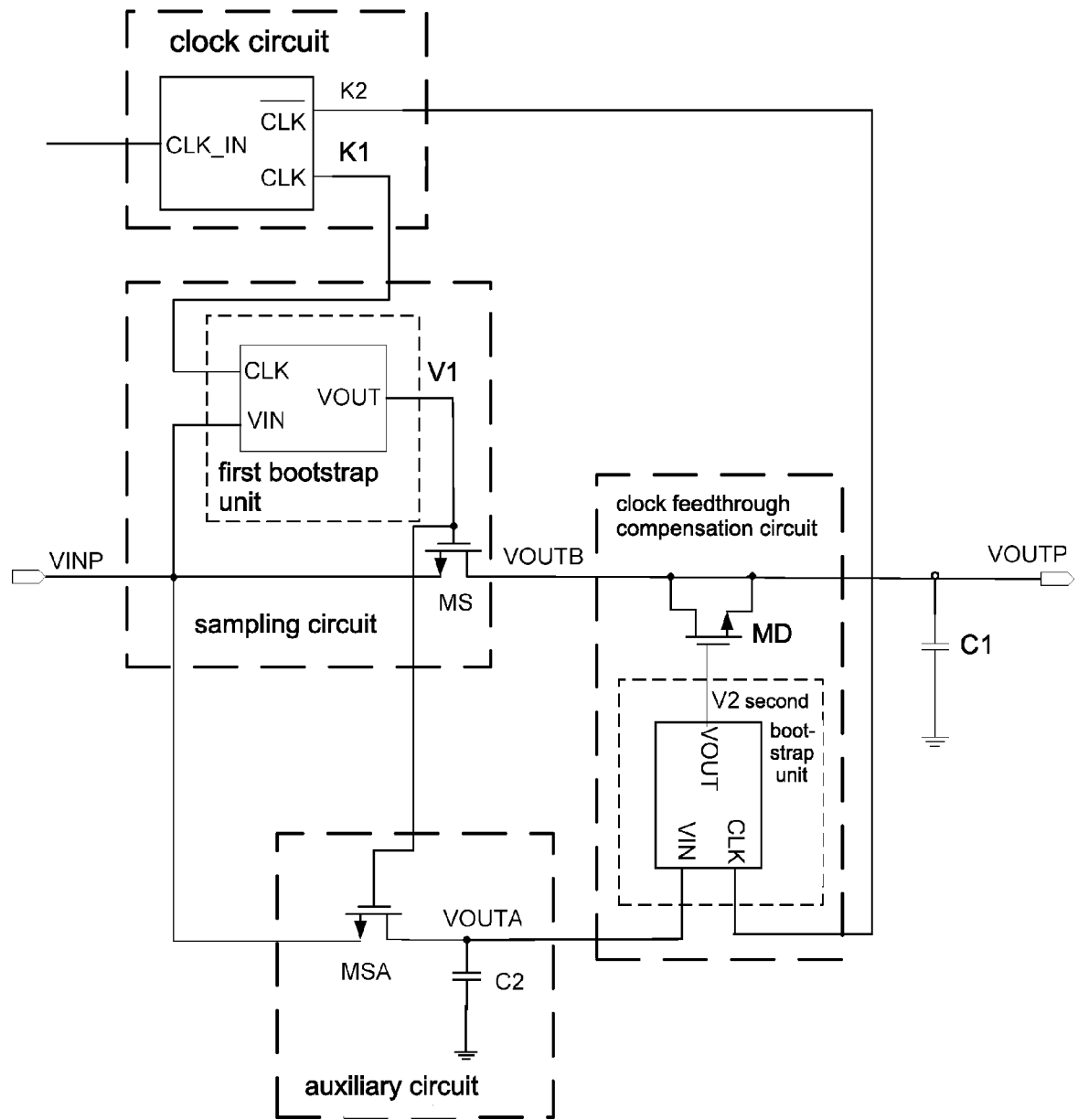
FIG. 3 is a schematic view of the sampling circuit for ADC according to a preferred embodiment of the present invention.

Specifically, referring to FIG. 3 of the drawings, according to another preferred embodiment of the present invention, the sampling circuit for ADC further comprises a first capacitor C1, wherein the clock circuit has a first output terminal K1 and a second output terminal K2, the first output terminal K1 and the second output terminal K2 output complementary clock pulses; i.e., when output of the first output terminal K1 is at high level, output of the second output terminal K2 is at low level, wherein jump of K1 and K2 are opposite, when level of the clock pulses outputted by the first output terminal K1 jumps from high level to low level, level of the clock pulses outputted by the second output terminal K2 jumps from low level to high level, wherein the sampling circuit comprises a first bootstrap unit and a first FET MS;

the auxiliary circuit comprises a second FET MSA and a second capacitor C2, and the first FET MS and the second FET MSA have same parameters;

the clock feedthrough circuit comprises a second bootstrap unit and a third FET MD;

wherein in this preferred embodiment of the present invention, the first bootstrap unit and the second bootstrap unit have identical structures and effects, which is well known to those skilled in the art.

Specific circuit connections of the sampling circuit for ADC according to the preferred embodiment are as follows.

Two input terminals of the first bootstrap unit are respectively connected with the first input terminal K1 of the clock circuit and the external input terminal, the external input terminal inputs a signal VINP to an input terminal of the first bootstrap unit;

an output terminal of the first bootstrap unit is connected with a gate electrode of the first FET MS, and voltage outputted by the first bootstrap unit is V1;

a source electrode of the first FET MS is connected with the external input terminal, and a drain electrode thereof is connected with an external output terminal, the drain electrode of the first FET MS outputs a signal VOUTB;

a first end of the first capacitor C1 is connected with the drain electrode of the first FET M1, and a second end thereof is grounded;

a gate electrode of the second FET MSA is connected with the gate electrode of the first FET MS, and a source electrode of the second FET MSA is connected with the external output terminal and outputs a signal VOUTA;

a first end of the second capacitor C2 is connected with a drain electrode of the second FET MSA, and a second end thereof is grounded;

two input terminals of the second bootstrap unit are respectively connected with a second output terminal K2 of the clock circuit and the second capacitor C2; and an output terminal of the second bootstrap unit is connected with a gate electrode of the third FET MD and outputs a voltage V2, both a drain electrode and a source electrode of the third FET MD are connected with the external output terminal In practical application of the sampling circuit for ADC of the present invention, the circuit adopts a fully-differential structure, and inverted input circuit and the positive going input circuit have the same structures which are as shown in FIG. 3 of the drawings. The difference lies in that in the inverted input circuit, signal VINP inputted by the input terminal is a reversed signal, while in the positive going input circuit, signal VINP inputted by the input terminal is a positive going signal.

Combining with FIG. 2 and FIG. 3 of the drawings, working principle of the sampling circuit for ADC of the present invention is illustrated as follows.

Function of the bootstrap unit is that when the control clock thereof is at high level, an output thereof is a constant voltage VC higher than an input thereof, and the output is at low level (the voltage thereof is 0) when the control clock is at low level. Therefore, in the sampling circuit for ADC of the present invention, when K1 is at high level and K2 is at low level, a potential difference between an output voltage V1 and an input signal VINP of the first bootstrap unit is a constant voltage VC, I.E., V1=VINP+VC, wherein V1 is at high level, an output voltage of the second bootstrap unit (a gate voltage of the third FET MD) V2=0. At this moment, the first FET MS samples the input signal VINP of the external input terminal, and outputs a signal VOUTB by an output terminal of a drain electrode thereof, the output signal VOUTB is preserved in the first capacitor C1, in such a manner that the output signal VOUTB is not varying with low level outputted by the output terminal K1 of the clock circuit. The second FET MSA is conducted, samples VINP, and outputs a signal VOUTA by an output terminal of a drain electrode of the second FET MSA, VOUTA=VOUTB=VINP, wherein the output signal VOUTA is preserved in the second capacitor C2, in such a manner that the output signal VOUTA is not varying with a low level outputted by an output terminal K1 of the clock circuit. In the same way, when K2 is at high level and K1 is at low level, the signal VOUTA can be inputted to the second bootstrap unit, and potential difference between an output voltage V2 and the input signal VOUTA is a constant voltage VC, i.e., V2=VOUTA+VC, i.e., V2 is at high level, and a gate voltage of the first FET MS V1=0.

An equivalent impedance of the first FET MS is $R_{MS}$, $$R_{MS} = \frac{1}{k(W/L)_{MS}(V1 - VINP - VTH)} = \frac{1}{k(W/L)_{MS}(VC - VTH)} \qquad (1)$$

wherein in the expression (1), k is a constant related to process, $(W/L)_{MS}$ is breadth length ratio of the first FET MS, VTH is a threshold voltage of MS. VC is a constant voltage, and it can be seen from expression (1) that impedance of $R_{MS}$ is a constant value, in such a manner that linearity of the equivalent impedance of the first FET MS is improved. Furthermore, the first capacitance C1 is a constant value, which ensures that sampling time of the first FET MS on the input signal VINP is a constant value T1, i.e., sampling time constant value T1=$R_{MS}$*C1, in such a manner that the first FET MS is capable of stably sampling on the input signal VINP.

In the positive going input circuit, when K1 is converted from high level to low level, i.e., K2 is converted from a low level to a high level, the voltage V1 is converted from a high level VINP+VC to 0 level, V1=0, i.e., V1 outputted is low level, in such a manner that neither the first FET MS nor the second FET MSA are capable of sampling the input signal VINP. In the process mentioned above, the first FET MS of the sampling circuit brings in clock feedthrough, and an effect of the clock feedthrough causes that variation of a voltage in the output signal VOUTB is:

$$\Delta V_{OUTP} = -\frac{C_{P\_GD\_MS}}{C_{P\_GD\_MS} + C_{P\_1}}(VINP + VC). \quad (2)$$

In the expression (2), $C_{P\_GD\_MS}$ is a parasitic capacitance between the gate electrode and the drain electrode of the first FET, $C_{P-1}$ is a capacitance of the first capacitor C1 in the positive going input circuit, VINP is a voltage value of the positive going input circuit, and since a level of K1 is converted from high level to low level, the variation of the voltage $\Delta V_{OUTP}$ is negative.

When the circuit adopts the fully-differential structure, the inverted input circuit has a same structure with the positive going input circuit, so the variation of the voltage in the output signal of the sampling circuit of the inverted input circuit is:

$$\Delta V_{OUTN} = -\frac{C_{N\_GD\_MS}}{C_{N\_GD\_MS} + C_{N\_1}}(VINN + VC) \quad (3)$$

wherein $C_{N\_GD\_MS}$ is a parasitic capacitance of the gate electrode and the drain electrode of the first FET in the converted input circuit, VINN is a converted input voltage value, $C_{N\_1}$ is a capacitance of the first capacitor C1 of the converted input circuit, since the inverted input circuit has a same structure with the positive going input circuit, $C_{N\_GD\_MS} = C_{P\_GD\_MS} = C_{GD\_MS}$, $C_{N\_1} = C_{P\_1} = C_1$.

Combining the expressions (2) and (3), a dynamic voltage of the differential sampling output signal is:

$$\Delta V_{DIFF} = \Delta V_{OUTP} - \Delta V_{OUTP} = -\frac{C_{GD\_MS}}{C_{GD\_MS} + C_1}(VINP - VINN). \quad (4)$$

It can be seen from the expression (4) that error of the differential sampling output signal brought by the clock feedthrough effect introduced by the parasitic capacitance between the gate electrode and the drain electrode of the first FET MS is proportional to the differential input signal, is non-linear, and is not capable of being eliminated by the differential structure. Furthermore, the greater is the parasitic capacitance of the first FET and the greater the amplitude of the input signal, the more obvious is the nonlinearity brought in by the clock feedthrough effect.

While K1 is converted from high level to low level, K2 is converted from low level to high level. At this moment, a voltage difference between the output voltage V2 of the second bootstrap unit and the input signal VOUTA is a constant voltage VC, i.e., V2=VOUTA+VC, and VOUTA=VOUTB=VINP, in such a manner that the input signal of the second bootstrap unit is identical with the input signal of the first bootstrap unit, i.e., the output voltage V2 is equal to V1, in such a manner that when K2 is at high level, the voltage V2 is equal to the voltage V1 when K1 is at high level, but has an opposite direction; and at this moment, V2 outputted by the second bootstrap circuit is:

$$V2=VOUTA+VC=VINP+VC \quad (5).$$

If the parasitic capacitance of the gate electrode of the third FET MD in the clock feedthrough circuit of the positive going input circuit is $C_{P\_G\_MD}$, variation of output voltage brought by the clock feedthrough circuit is:

$$\Delta V_{OUTP\_F} = \frac{C_{P\_G\_MD}}{C_{P\_G\_MD} + C_1}(VINP + VC) \quad (6)$$

Similarly, in the inverted input circuit, variation of output voltage brought by the clock feedthrough circuit is:

$$\Delta V_{OUTN\_F} = \frac{C_{N\_G\_MD}}{C_{N\_G\_MD} + C_1}(VINN + VC) \quad (7)$$

wherein $C_{N\_G\_MD}$ is the parasitic capacitance of the gate electrode of the third FET MD in the clock feedthrough circuit of the inverted input circuit, so $C_{N\_G\_MD} = C_{P\_G\_MD} = C_{G\_MD}$, and the transient compensation voltage outputted by the clock feedthrough circuit is:

$$\Delta V_{DIFF\_F} = \Delta V_{OUTP\_F} - \Delta V_{OUTP\_F} = \frac{C_{G\_MD}}{C_{G\_MD} + C_1}(VINP - VINN). \quad (8)$$

In the present invention, since the sum of the gate-drain parasitic capacitance and the gate-source parasitic capacitance of the third FET MD is equal to the gate-drain parasitic capacitance of the first FET MS, the parasitic capacitance of the third FET MD is a half of the parasitic capacitance of the first FET MS, i.e., $C_{G\_MD} = C_{GD\_MS}$, which is substituted into the expressions (4) and (8) to result in that the third FET MD generates a transient compensation voltage equal to the voltage in the expression (4) and having an opposite position on the external output terminal thereof. The signal VOUTP outputted by the external output terminal is outputted after adding together sampling signals and dynamic voltages outputted by the sample circuit and the transient compensation voltage outputted by the clock feedthrough circuit, in such a manner that the transient compensation voltage generated by the clock feedthrough circuit eliminates the impacts of the dynamic voltage is generated in the differential sampling output signal due to clock feedthrough effect of the first FET to the sampling output signal. Furthermore, the sampling circuit for ADC of the present invention is not affected on normal output of the sampling signal, improves linearity of sampling FET, reduces harmonic distortion of the sampling circuit and improves sampling speed thereof, and improves sampling accuracy of the sampling circuit for ADC.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A sampling circuit for ADC (Analog-to-Digital Converter), comprising:
    an external input terminal,
    a sampling circuit and an auxiliary circuit which are connected with the external input terminal,
    a clock circuit and an external output terminal which are connected with the sampling circuit, and
    a clock feedthrough circuit connected with the auxiliary circuit, wherein the clock feedthrough circuit is respectively connected with the clock circuit and the external output terminal.

2. The sampling circuit for ADC, as recited in claim 1, wherein the clock circuit has a first output terminal and a second output terminal, and the first output terminal and the second output terminal output complementary clock pulses;
    wherein the sampling circuit samples signals inputted by the external input terminal under control of clock pulses outputted by the first output terminal of the clock circuit, and outputs signals obtained by sampling to the external output terminal;
    wherein the auxiliary circuit samples the signals inputted by the external input terminal under control of the sampling circuit, and preserves signals obtained by sampling; and
    wherein the clock feedthrough circuit processes signals obtained by sampling of the auxiliary circuit under control of clock outputted by the second output terminal of the clock circuit so as to generate a transient compensation voltage having an opposite direction with a dynamic voltage in the sampling circuit, and outputs the transient compensation voltage to the external output terminal.

3. The sampling circuit for ADC, as recited in claim 2, further comprising a first capacitor,
    wherein a first end of the first capacitor is connected with a drain electrode of the first FET, and a second end thereof is grounded, so as to preserve signals and voltages obtained by sampling of the sampling circuit.

4. The sampling circuit for ADC, as recited in claim 3, wherein the sampling circuit comprises a first bootstrap unit and a first FET,
    wherein two output terminals of the first bootstrap unit are respectively connected with the first output terminal of the clock circuit and the external input terminal,
    wherein an output terminal of the first bootstrap unit is connected with a gate electrode of the first FET,
    wherein a source electrode of the first FET is connected with the external input terminal, and a drain electrode of the first FET outputs signals by sampling.

5. The sampling circuit for ADC, as recited in claim 4, wherein the auxiliary circuit comprises a second FET and a second capacitor,
    wherein a gate electrode of the second FET is connected with the gate electrode of the first FET, and a source electrode thereof is connected with the external input terminal,
    wherein the second FET samples signals inputted by the external input terminal under control of the sampling circuit, and
    wherein a first end of the second capacitor is connected with a drain electrode of the second FET, and a second end thereof is grounded, so as to preserve signals and voltages obtained by sampling of the second FET.

6. The sampling circuit for ADC, as recited in claim 5, wherein the clock feedthrough circuit comprises a third FET and a second bootstrap unit,
    wherein two input terminals of the second bootstrap unit are respectively connected with the second output terminal of the clock circuit and the first end of the second capacitor,
    wherein an output terminal of the second bootstrap unit is connected with a gate electrode of the third FET, and both a drain electrode and a source electrode of the third FET are connected with the external output terminal.

7. The sampling circuit for ADC, as recited in claim 6, wherein the first FET and the second FET have the same parameters.

8. The sampling circuit for ADC, as recited in claim 6, wherein a sum of a gate-drain parasitic capacitance and a gate-source parasitic capacitance of the third FET is equal to a gate-drain parasitic capacitance of the first FET.

* * * * *